US010111354B2

(12) United States Patent
Hu (10) Patent No.: US 10,111,354 B2
(45) Date of Patent: Oct. 23, 2018

(54) STORAGE CARRIER (71) Applicant: CHENBRO MICOM CO., LTD., New Taipei (TW)

(72) Inventor: Tseng-Hsun Hu, New Taipei (TW)

(73) Assignee: CHENBRO MICOM CO., LTD., New Taipei (TW)

( * ) Notice: Subject to any disclaimer, the term of this patent is extended or adjusted under 35 U.S.C. 154(b) by 0 days.

(21) Appl. No.: 15/007,480

(22) Filed: Jan. 27, 2016

(65) Prior Publication Data
US 2017/0011775 A1  Jan. 12, 2017

(30) Foreign Application Priority Data

Jan. 27, 2015 (TW) .............................. 104201283 U (51) Int. Cl.
*H05K 7/14* (2006.01)
*H05K 7/18* (2006.01)
*G11B 33/12* (2006.01)

(52) U.S. Cl.
CPC ......... *H05K 7/1487* (2013.01); *G11B 33/124* (2013.01); *H05K 7/14* (2013.01); *H05K 7/18* (2013.01)

(58) Field of Classification Search
CPC ........ A47B 96/06; A47B 81/00; A47G 29/00; A47K 1/00; E04G 3/00; E04G 5/06; F21V 21/00; F21V 35/00; H05K 7/1418; H05K 5/03; H05K 7/14; H05K 7/18; G06F 2003/00

USPC ....... 248/220.21, 221.21, 221.11; 312/223.2, 312/223.1; 361/679.33, 679.37
See application file for complete search history.

(56) References Cited

U.S. PATENT DOCUMENTS

| | | | | |
|---|---|---|---|---|
| 6,297,954 | B1 * | 10/2001 | Seo | G06F 1/184 361/679.02 |
| 7,679,896 | B2 * | 3/2010 | Deng | G06F 1/187 312/223.1 |
| 8,371,542 | B2 * | 2/2013 | Zhang | H05K 7/1489 248/220.21 |
| 8,496,493 | B2 * | 7/2013 | Lin | G06F 1/187 439/345 |
| 8,544,801 | B2 * | 10/2013 | Ting | G06F 1/187 248/220.21 |
| 8,556,219 | B2 * | 10/2013 | Li | G06F 1/187 248/220.21 |

(Continued)

*Primary Examiner* — Nkeisha Smith
(74) *Attorney, Agent, or Firm* — Bacon & Thomas, PLLC (57) ABSTRACT

An storage carrier, having a body, the body having a substrate, a first frame board and a second frame board, with the first and second frame boards disposed at two opposite ends of the substrate, respectively, allowing a receiving space to be formed between the first frame board and the second frame board and adapted to receive and position an storage device. First positioning portions and second positioning portions are disposed on opposing inner sides of the first frame board and the second frame board and engaged with fixing holes of the storage device, respectively, with the first positioning portions being of higher structural rigidity than the second positioning portions, where a panel is coupled to another end of the substrate and positioned proximate to the first frame board and the second frame board, with a lid movably pivotally connected to the panel.

10 Claims, 10 Drawing Sheets

(56) References Cited

U.S. PATENT DOCUMENTS

| | | | | |
|---|---|---|---|---|
| 8,837,136 B2* | 9/2014 | Hu | ............... | G11B 33/124 |
| | | | | 248/220.21 |
| 2008/0259554 A1* | 10/2008 | Qin | ............... | G06F 1/187 |
| | | | | 361/679.34 |
| 2011/0101831 A1* | 5/2011 | Wang | ............... | G06F 1/187 |
| | | | | 312/223.1 |
| 2011/0215687 A1* | 9/2011 | Chen | ............... | H05K 5/02 |
| | | | | 312/223.2 |
| 2012/0293945 A1* | 11/2012 | Wang | ............... | G11B 33/08 |
| | | | | 361/679.33 |
| 2013/0264444 A1* | 10/2013 | Su | ............... | G11B 33/128 |
| | | | | 248/221.11 |
| 2013/0313955 A1* | 11/2013 | Kuo | ............... | G11B 33/124 |
| | | | | 312/326 |
| 2014/0211401 A1* | 7/2014 | Lee | ............... | G06F 1/187 |
| | | | | 361/679.31 |

* cited by examiner

STORAGE CARRIER

BACKGROUND OF THE INVENTION

1. Field of the Invention

The present invention relates to storage carriers and, more particularly, to an storage carrier characterized in that: an storage device is disposed in a receiving space formed between a first frame board and a second frame board of a body; and fixing holes disposed at two ends of the storage device are engaged with first positioning portions of the first frame board and second positioning portions of the second frame board, respectively, to effectuate a positioning.

2. Description of the Prior Art

Given today's trend toward network-based cloud technology and Internet of Things (IOT), computer server technology develops rapidly by leaps and bounds and changes rapidly, aiming at robust compute capability, high speed and compactness. To process voluminous data computation, computer servers require intensively numerous high-density recording medium machines, such as hard disk drives, CD-ROM, and CD-RW, for storing data. However, a server case is movably held within a receiving space of every bay in a conventional rack server, and server units are connected to each other to effectuate server multiplexing. Hence, a device servo system in its entirety is regarded as an enormous cabinet, and each server case holds recording medium machines to increase the storage capacity of the rack server.

Depending on height, conventional server cases come in four specifications, namely 1 U, 2 U, 3 U and 4 U, wherein U (unit) is defined as a unit height of a cabinet. Basically, a cabinet of 1 U is 19 inches wide and 4.445 cm tall, whereas a cabinet of 2 U is 19 inches wide and 8.89 cm tall, and thus the width and height of cabinets of 3 U, 4 U are inferred by analogy. Hence, with all servers being subjected to a specification limit of equal size and space, manufacturers have to study how to place more recording medium machines within limited space and give considerations to difficulties in spatial configuration, means of securing, assembly, disassembly and replacement of the recording medium machines contained in server cases with a view to designing a structure that takes up little space and is easy to maintain and change.

Furthermore, since conventional server cases and storage-oriented/telecommunication-oriented cabinets contain plenty of recording medium machines, the recording medium machines contained in the cases and cabinets must be changed easily and quickly in order for users to perform maintenance or replacement operations on the recording medium machines. Moreover, considerations must be given to assembly structures and component manufacturing costs in order to meet the need for a large number of recording medium machines and achieve cost-effectiveness thereof. Also, after long use of server cases, considerations must be given to stability and ease of maintenance and replace of the system in its entirety as well as convenience of users' operation to reduce loss arising from shutdowns and incurred labor costs. However, some conventional recording medium machines are fixed in place inside server cases by screws, and it is time-consuming for the screws to be aimed at and driven into screw holes, thereby lengthening the shutdown-maintenance duration greatly. If there are plenty of components, such as interface cards, recording medium machines, power lines and bus lines, inside the server cases, it will be inconvenient for a screwdriver to perform a screwing process inside the server cases, not to mention that the screws may get lost during the screwing process. In the event of inappropriate size of the screws and performing the screwing process forcibly, the fixing holes of the recording medium machines will be damaged to the detriment of assembly and disassembly.

Furthermore, servers are often provided in computer facilities of a data center and a telecommunication/storage system and can be equipped with tens of thousands of recording medium machines which can be disassembled quickly to undergo maintenance and replacement, if the recording medium machines take up little space and feature ease of maintenance and replacement. Therefore, the prior art still has room for improvement.

SUMMARY OF THE INVENTION

In view of the aforesaid problems and drawbacks of the prior art, the inventor of the present invention collected related data, carried out evaluation thereof, conducted tests and made corrections repeatedly according to the inventor's experience and expertise, thereby devising an storage carrier.

An objective of the present invention is as follows: a body has a substrate, a first frame board and a second frame board; the first and second frame boards are disposed at two opposing ends of the body, respectively; first positioning portions and second positioning portions are disposed on opposing inner surfaces of the first frame board and the second frame board, respectively; the first positioning portions exhibit higher structural rigidity than the second positioning portions; a panel is coupled to the other end of the substrate and positioned proximate to the first frame board and the second frame board; a lid is movably pivotally connected to the panel to form a hard disk drive tray structure; an storage device is transversely disposed in a receiving space of the body; fixing holes disposed at two ends of the storage device are engaged with the first positioning portions of the first frame board and the second positioning portions of the second frame board to effectuate a positioning and facilitate modularized assembly; the aforesaid design prevents the storage device from loosening inappropriately under an external force but ensures that the storage device is capable of blocking, positioning, stopping and retracting in a stable manner; and the storage device allows an assembly process to be performed quickly and without any tool so as to attain structural stability and ease of operation.

Another objective of the present invention is as follows: a plurality of leaf springs is disposed on the second frame board of the body and corresponds in position to the first positioning portions; the second positioning portions are disposed on inner surfaces of the leaf springs; one end of the storage device is obliquely inserted into a receiving space of the body to abut against the first frame board so that the fixing holes are engaged with the first positioning portions, respectively; then, the storage device pushes the second positioning portion to cause the leaf springs to undergo an outward swing displacement; after the storage device has been pressed inward until it is positioned, the leaf springs restore an initial state and push the storage device laterally so that the fixing holes are engaged with the second positioning portions, respectively; a limit hole at the bottom of the storage device is engaged with a third positioning portion of the substrate to position it; when being withdrawn from the case, the body exerts a pull-resisting force for resisting a connector; hence, the overall structure is more stable.

Yet another objective of the present invention is as follows: a plurality of openings is disposed on the second frame board of the body and corresponds in position to the first positioning portions; cantilever-shaped leaf springs are disposed at the openings; a coupling portion with a plurality of riveting posts is disposed at the periphery of the openings each; fixing holes disposed on one or two sides of the leaf springs and the riveting posts of the coupling portion are riveted and coupled together integrally; prepressing creases are disposed on the leaf springs and disposed between the second positioning portions and the fixing holes to provide the resilience required for the deformation of the leaf springs; the second frame board is manufactured separately from the leaf springs so that the leaf springs are made of stainless steel or manganese steel, whereas the substrate, first frame board and second frame board are made of a material of a lower cost and a lower coefficient of resilience than the leaf springs, such as hot-dip galvanized steel in coils (SGCC) or plastics, so as to cut material costs effectively.

A further objective of the present invention is as follows: to take out the storage device, the user inserts his or her finger into a notch disposed on the body and corresponding in position to the rear of the substrate and lifts the storage device from below so that the second positioning portions are laterally pushed by the storage device to cause the leaf springs to undergo an outward swing displacement; as a result, the limit holes and the fixing holes of the storage device are no longer restrained by the second positioning portions, first positioning portions and third positioning portion, respectively, allowing the user to take out the storage device easily and enhancing production efficiency as well as ease of maintenance and replacement.

In an embodiment, the storage device tray structure of the invention, at least one hollowed-out penetrating hole is disposed on the substrate of the body, and a plurality of blocking plates is disposed in front of the at least one penetrating hole and each bend upward to abut against a front of the storage device.

In another embodiment, the storage device tray structure of the invention, at least one third positioning portion is disposed on the substrate of the body and positioned proximate to the second frame board, and the at least one third positioning portion has engaging bumps for engaging with a limit hole disposed at a bottom of the storage device.

In another embodiment, the storage device tray structure of the invention, a plurality of leaf springs corresponding in position to the first positioning portions is disposed on the second frame board of the body, and the second positioning portions are disposed on inner sides of the leaf springs and engaged with the fixing holes as soon as the storage device pushes and causes the leaf springs to undergo an outward swing displacement and restore an initial state, wherein a plurality of flat elevation portions is disposed on the substrate of the body, positioned proximate to the first frame board and the second frame board, and adapted to abut against a bottom of the storage device, wherein at least one third positioning portion is disposed on the elevation portions and positioned at rear of the substrate and proximate to the leaf springs, wherein the at least one third positioning portion has engaging bumps for engaging with a limit hole disposed at a bottom of the storage device.

In another embodiment, the storage device tray structure of the invention, the first positioning portions of the first frame board of the body are abutting bumps which are cylindrical and extend transversely.

In another embodiment, the storage device tray structure of the invention, a plurality of leaf springs is disposed on the second frame board of the body and corresponds in position to the first positioning portions, and the second positioning portions are disposed on inner surfaces of the leaf springs to allow the storage device to push and cause the leaf springs to undergo an outward swing displacement and restore an initial state, thereby allowing the fixing holes to engage with the first positioning portions and the second positioning portions.

Moreover, a plurality of openings is disposed on the second frame board, corresponds in position to the first positioning portions, and has the cantilever-shaped leaf springs, and limit bumps, each of which is arcuate and round and rises toward the receiving space, are disposed on the second positioning portion of the leaf springs, respectively.

Further, a coupling portion with a plurality of riveting posts is disposed on outer rims of the openings of the second frame board, wherein a plurality of cantilever-shaped fixing holes, which the riveting posts are riveted to and thus fixed in place so that other ends of the leaf springs are transversely inserted into the openings, is disposed laterally on the leaf springs each, wherein longitudinal prepressing creases are formed on the leaf springs and between the second positioning portions and the fixing holes.

Furthermore, inner edges of the openings of the second frame board extend downward to form the cantilever-shaped leaf springs, respectively.

Furthermore, the leaf springs are made of one of stainless steel and manganese steel, whereas the substrate, the first frame board and the second frame board of the body are made of a material of a lower coefficient of resilience than the leaf springs, including hot-dip galvanized steel in coils (SGCC) and plastics.

In another embodiment, the storage device tray structure of the invention a front side board is disposed at another end of the substrate of the body and positioned proximate to the first frame board and the second frame board, wherein a light-guiding plate is penetratingly disposed on the panel coupled to the front side board and extends backward to the first frame board, wherein a positioning-engaging plate is coupled to outer surfaces of the first frame board and the second frame board and positioned on an outer side of the light-guiding plate, wherein a plurality of resilient elevated portions is disposed on the positioning-engaging plate.

Moreover, a plurality of snap-engagement plates is disposed on the outer surfaces of the first frame board and the second frame board, wherein a snap-engagement slot is disposed at each of two ends of the panel and posterior to the panel, with a plurality of fastening holes disposed on the positioning-engaging plates such that the snap-engagement plates are engaged with the fastening holes and fitted therein integrally, wherein engaging blocks are disposed in front of the positioning-engaging plates, engaged with and disposed in the snap-engagement slots, respectively, to effectuate a positioning.

DETAILED DESCRIPTION OF THE EMBODIMENT OF THE INVENTION

To achieve the aforesaid objectives and advantages, the structures and technical means of the present invention are illustrated with drawings and preferred embodiments of the present invention in terms of structures and functions and described below.

Referring to FIGS. 1, 2, 3, 4, 5, there are shown a perspective view, an exploded view, another exploded view from another angle of view, a perspective view taken before an storage device is pressed into, and a rear view taken after the storage device is pressed into, of an storage carrier according to a preferred embodiment of the present invention. As shown in the diagrams, the storage carrier of the present invention comprises a body 1. The body 1 has a substrate 11, a first frame board 12 and a second frame board 13. The first frame board 12 and the second frame board 13 are upright and are disposed at two opposite ends of the substrate 11, respectively. A receiving space 10 is formed between the first frame board 12 and the second frame board 13. A plurality of first positioning portions 121 each having an abutting bump 1211 which is cylindrical and extends transversely is disposed on the inner side the first frame board 12. A plurality of openings 130 each corresponding in position to the first positioning portions 121 is disposed on the second frame board 13. A cantilever-shaped leaf spring 132 is disposed at each opening 130. A baffle 1301 having a stepped surface and bending to extend toward the leaf spring 132 is disposed on the inner edge of each opening 130. Second positioning portions 131 are disposed on the inner side of the second frame board 13 or the leaf springs 132, respectively. A limit bump 1311 which is arcuate and round and rises toward the receiving space 10 is disposed on the second positioning portion 131. At least one third positioning portion 111 having longitudinally extending cylindrical engaging bumps 1111 is disposed on the substrate 11 and positioned proximate to the second frame board 13. The at least one third positioning portion 111 of the substrate 11, the first positioning portions 121 of the first frame board 12, the second positioning portions 131 of the second frame board 13 may dispense with the engaging bumps 1111, abutting bumps 1211, and limit bumps 1311, respectively. An engaging plate (not shown) bending upward is disposed on the first positioning portions 121, the second positioning portions 131 and the at least one third positioning portion 111 each.

Figure 1:
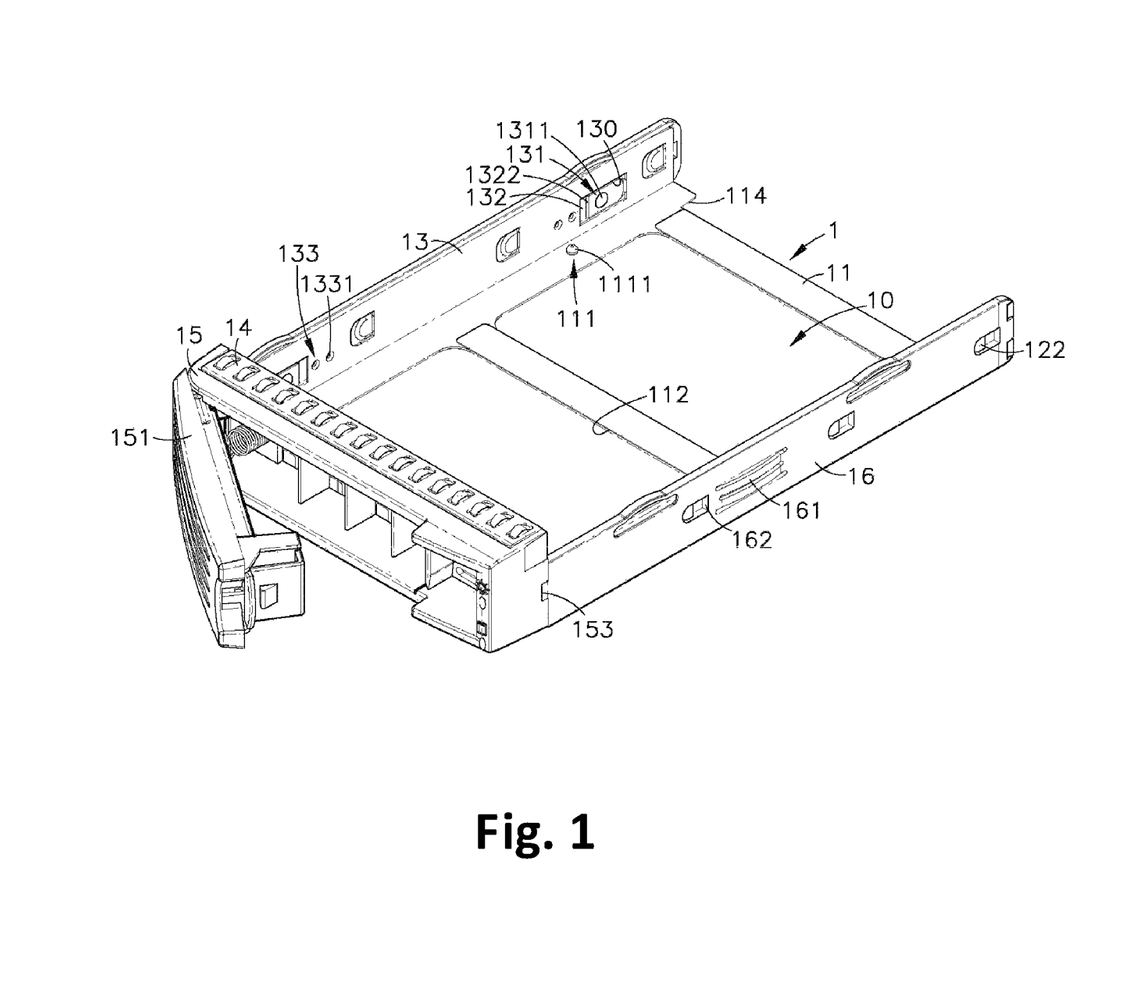
FIG. 1 is a perspective view of a storage carrier according to a preferred embodiment of the present invention.
Figure 2:
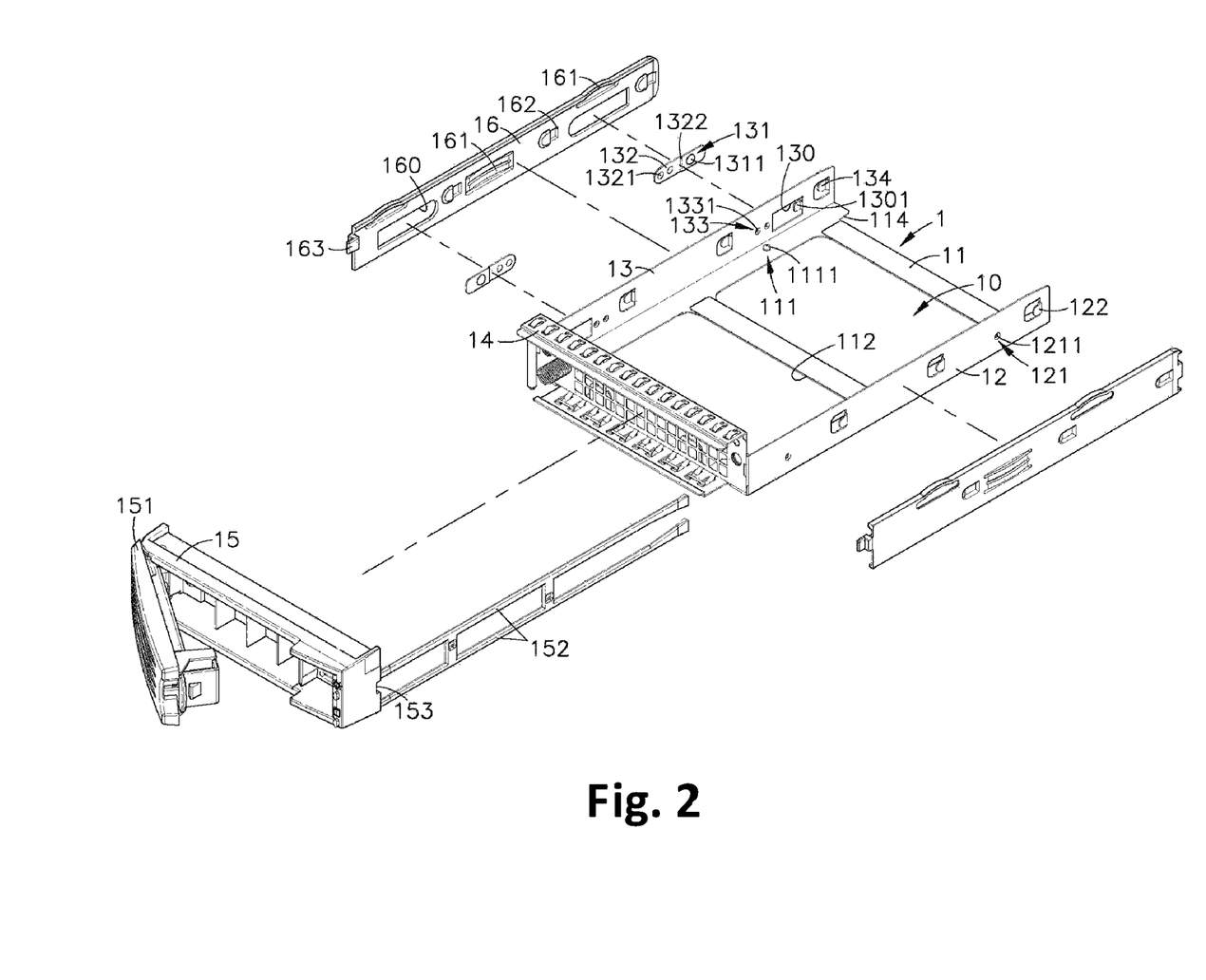
FIG. 2 is a exploded view of the storage carrier according to a preferred embodiment of the present invention.
Figure 3:
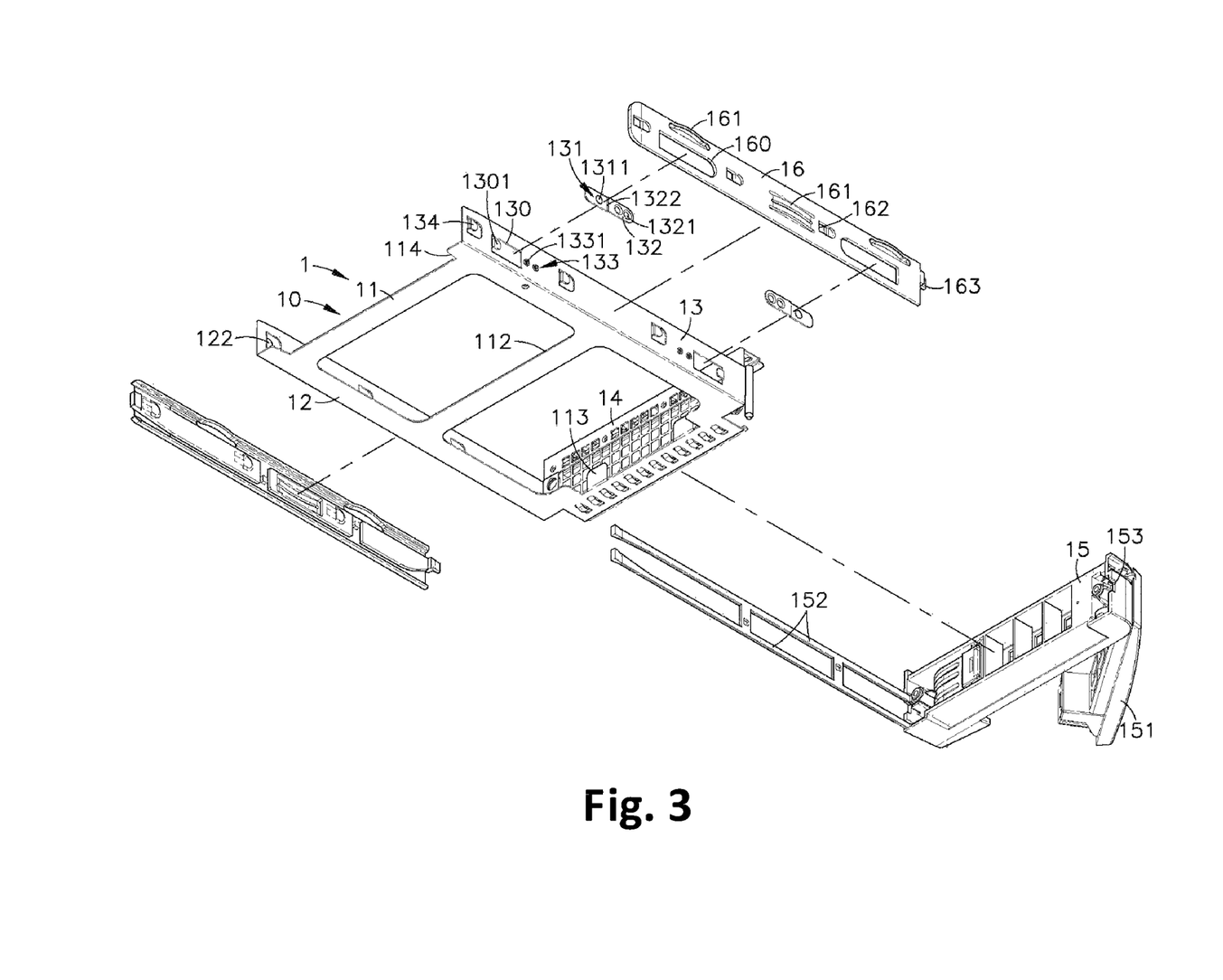
FIG. 3 is another exploded view of the storage carrier according to a preferred embodiment of the present invention.

At least one hollowed-out penetrating hole 112 is formed on the substrate 11 of the body 1. A plurality of blocking plates 113 bending upward to become upright is disposed in front of the at least one penetrating hole 112 and flanks the at least one penetrating hole 112. The second frame board 13 is manufactured separately from the leaf springs 132. A coupling portion 133 with a plurality of riveting posts 1331 is disposed on the outer rims of the openings 130 of the second frame board 13. A plurality of fixing holes 1321 is disposed laterally on the leaf springs 132 each. A prepressing crease 1322 extending longitudinally is disposed on each leaf spring 132 and between the second positioning portions 131 and the fixing holes 1321. The two fixing holes 1321 of each leaf spring 132 fit around the riveting posts 1331 of the coupling portion 133, respectively, so that the leaf spring 132 and the coupling portion 133 are coupled together by means of riveting. The other end of each leaf spring 132 is transversely inserted into a corresponding one of the openings 130 to become cantilever-shaped. In practice, it is also feasible for the fixing holes 1321 to flank each leaf spring 132 so that the leaf spring 132 and the coupling portion 133 are coupled together by mans of riveting.

With the second frame board 13 being manufactured separately from the leaf springs 132, the leaf springs 132 are each integrally formed and made of stainless steel, manganese steel or any steel of a high coefficient of resilience. The substrate 11, the first frame board 12 and the second frame board 13 of the body 1 are each integrally formed and made of hot-dip galvanized steel in coils (SGCC), plastics or any other material of a coefficient of resilience lower than the leaf springs 132 to allow the first positioning portions 121 of the first frame board 12 to exhibit higher structural rigidity than the leaf springs 132 and the second positioning portions 131 of the second frame board 13.

A front side board 14 bending upward to become upright is disposed on the other end of the substrate 11, positioned proximate to the first frame board 12 and second frame board 13, and coupled to a panel 15. A lid 151 is pivotally connected to the panel 15 so that the panel 15 is shut when snap-engaged with the lid 151 or opened when disengaged from the lid 151. A hollowed-out light-guiding plate 152 is penetratingly disposed on the panel 15 and outside the lid 151 and extends backward to the first frame board 12. A snap-engagement slot 153 is disposed at each of the two ends of the panel 15 and posterior to the panel 15. A plurality of snap-engagement plates 122, 134 each having a stepped surface and bending to extend outward is disposed on the outer sides of the first frame board 12 and the second frame board 13, respectively. A positioning-engaging plate 16 is coupled to the first frame board 12 and the second frame board 13 each. One of the positioning-engaging plates 16 is positioned outside the light-guiding plate 152 in a manner that they abut against each other. A through hole 160 of a larger diameter than the opening 130 is disposed on the positioning-engaging plate 16 and corresponds in position to the opening 130. A plurality of resilient elevated portions 161 is disposed on the outer sides of the positioning-engaging plates 16 and at the top of the positioning-engaging plates 16. A plurality of fastening holes 162 is disposed on the positioning-engaging plates 16 each. The snap-engagement plates 122, 134 are disposed in, engaged with, and coupled to the fastening holes 162, respectively. Engaging blocks 163 are disposed in front of the positioning-engaging plates 16, engaged with and disposed in the snap-engagement slots 153, respectively, to effectuate a positioning. However, structural designs of the body 1 abound. Depending on applications or case design changes, the body 1 may come in the form of a tray-like structure, such as a hard disk drive enclosure or a solid state drive adapter, and its fine structures are not described herein for the sake of brevity.

Figure 4:
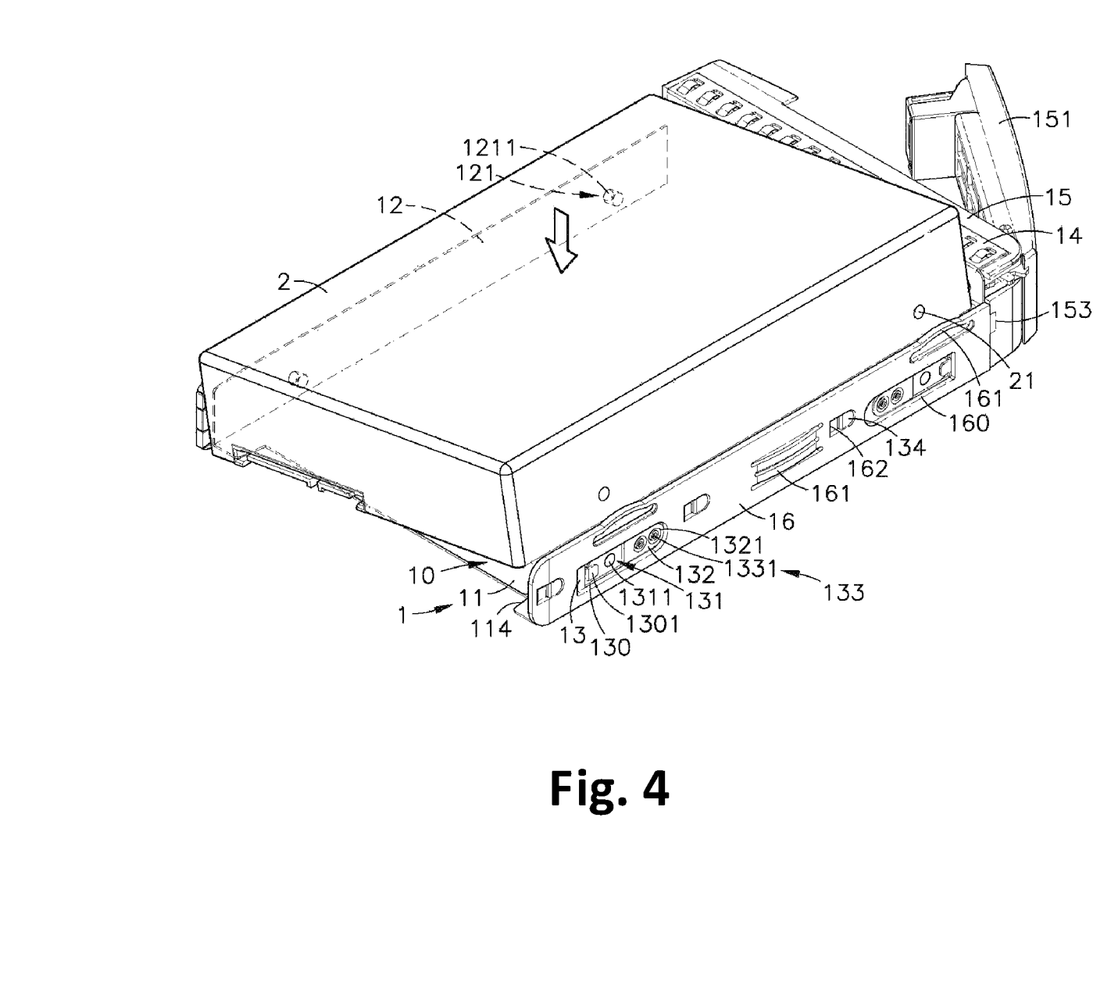
FIG. 4 is a perspective view of the storage carrier according to a preferred embodiment of the present invention.
Figure 5:
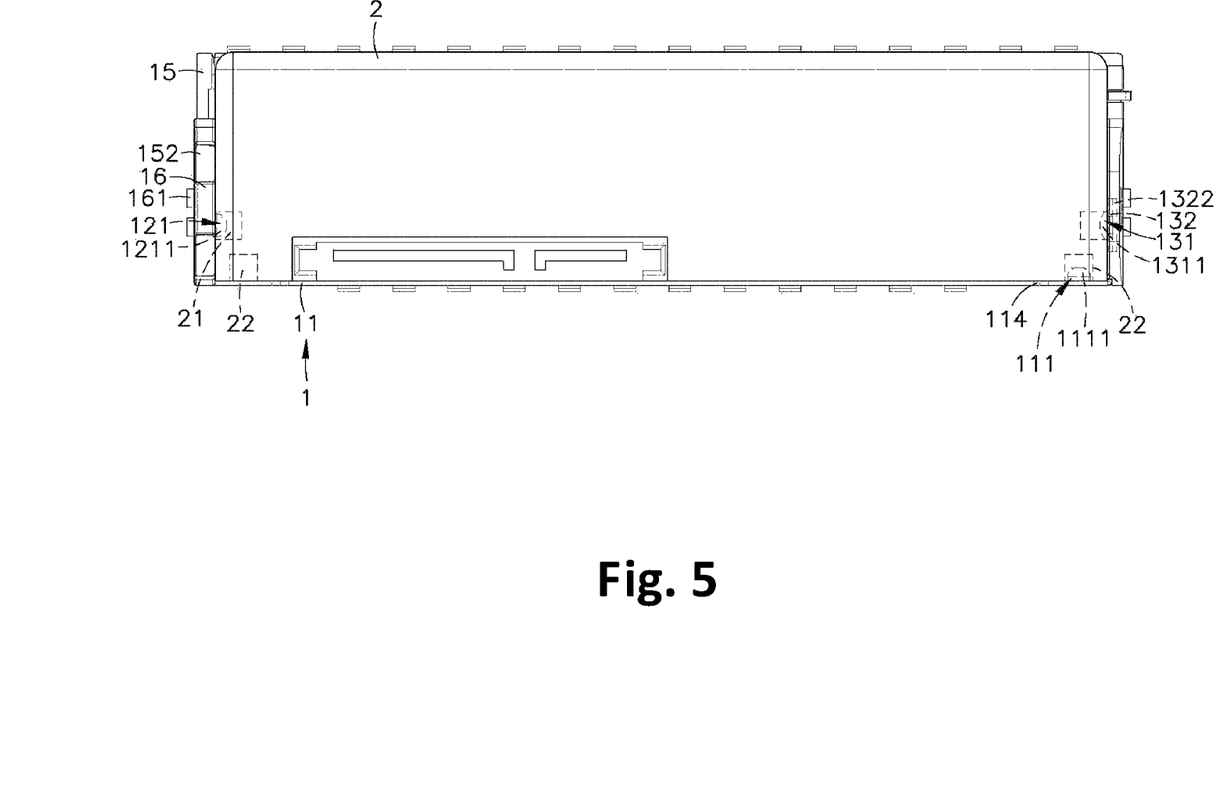
FIG. 5 is a rear view of the storage carrier according to a preferred embodiment of the present invention.
Figure 6:
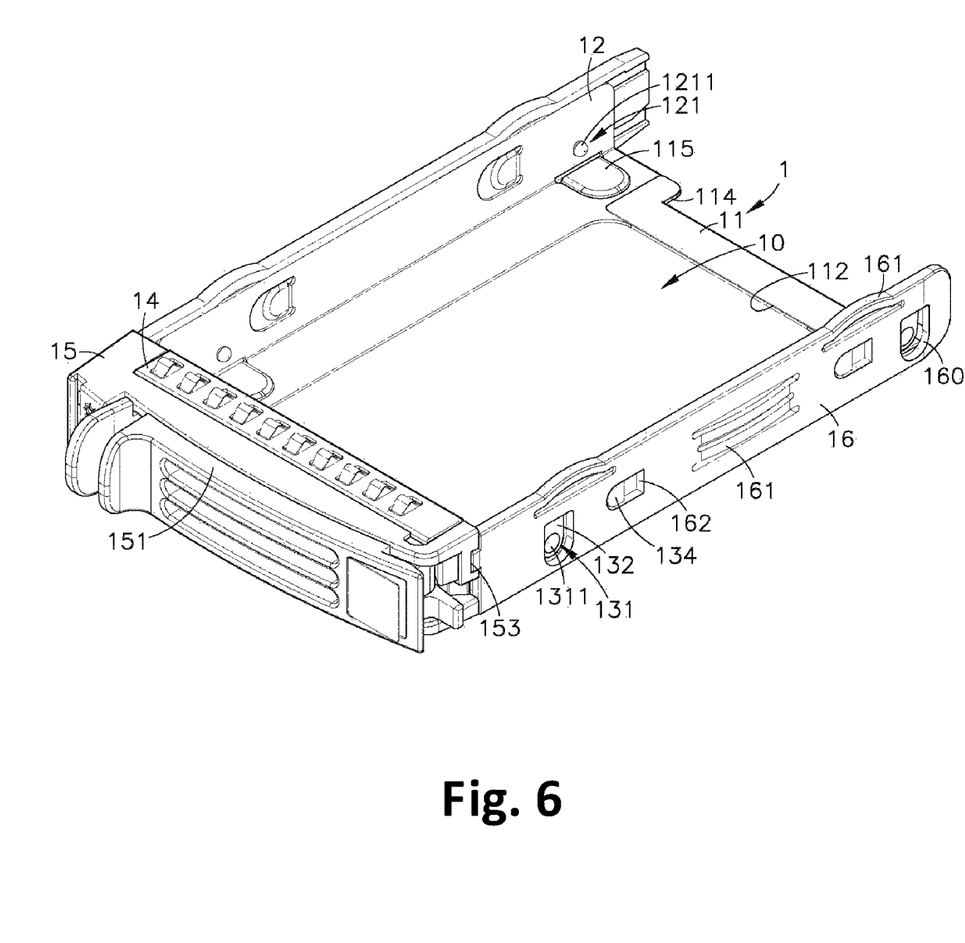
FIG. 6 is a perspective view of the storage carrier according to another preferred embodiment of the present invention.
Figure 7:
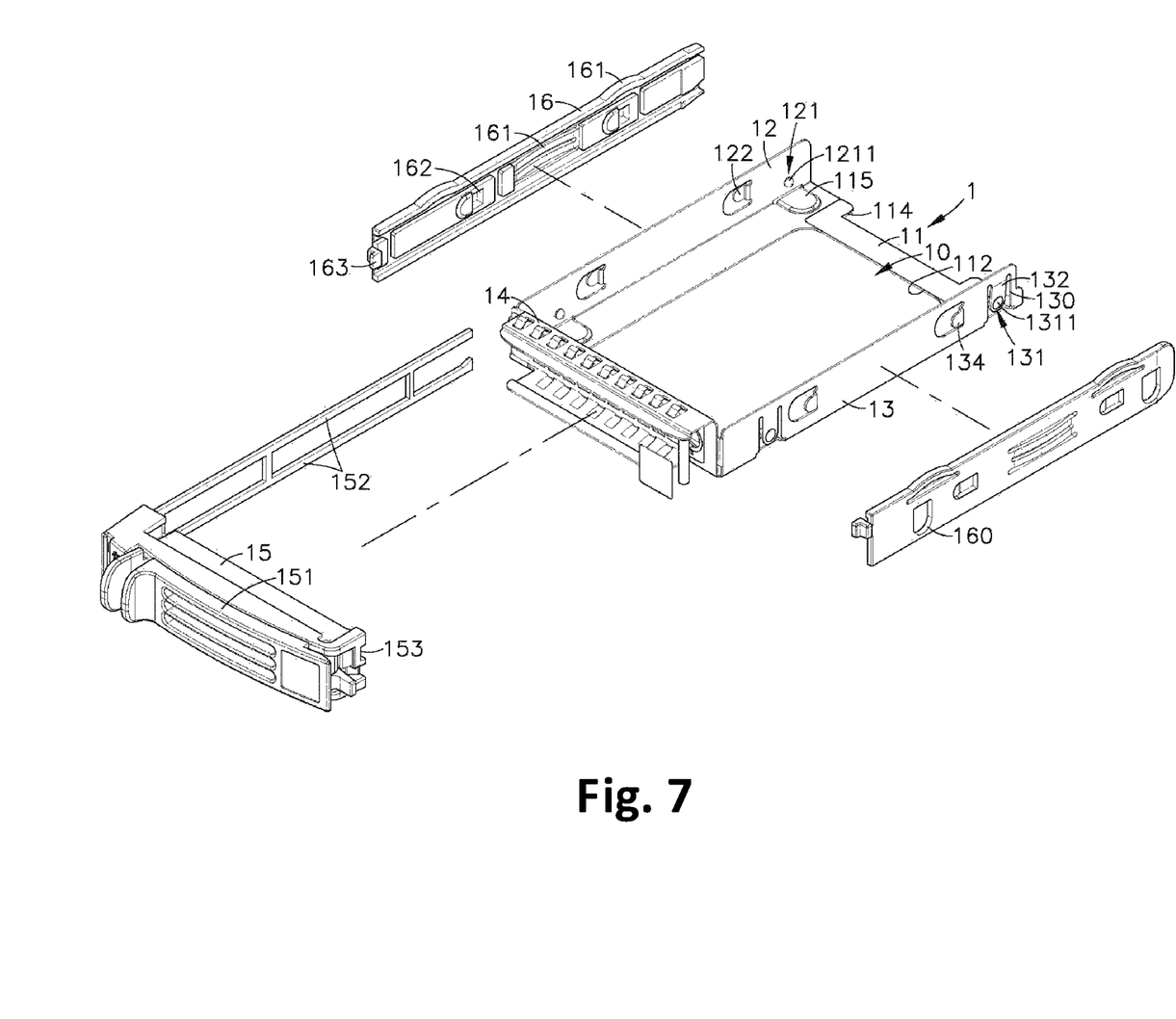
FIG. 7 corresponds to FIG. 6 is a exploded view of the storage carrier according to another preferred embodiment of the present invention.
Figure 8:
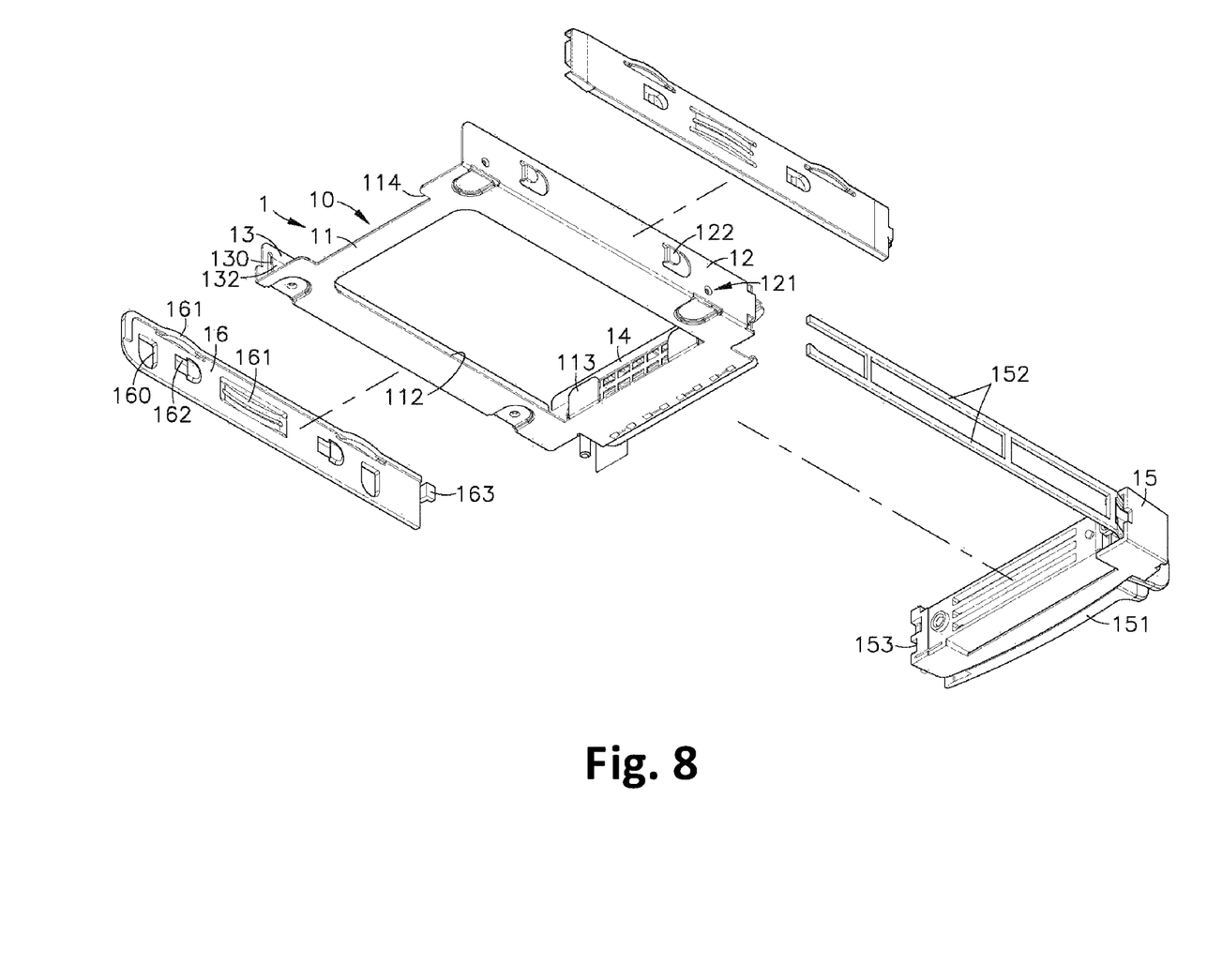
FIG. 8 corresponds to FIG. 6 is another exploded view of the storage carrier according to another preferred embodiment of the present invention.

The assembly process of the present invention is described below. An storage device 2, such as a 3.5-inch hard drive, is tilted and inserted into the receiving space 10 of the body 1. The front of the storage device 2 abuts against the blocking plates 113 of the substrate 11. One end of the storage device 2 abuts against the inner side of the first frame board 12 so that fixing holes 21 disposed laterally on the storage device 2 are engaged with the abutting bumps 1211 of the first positioning portions 121, respectively, to effectuate a positioning. The storage device 2 is pressed downward and thus placed in the receiving space 10 of the body 1; meanwhile, the bottom of the other end of the storage device 2 presses against the limit bumps 1311 of the second frame board 13 the second positioning portions 131. The second positioning portions 131 are pushed; hence, not only do the second positioning portions 131 use the prepressing creases 1322 of the leaf springs 132 as a fulcrum for undergoing an outward swing displacement and thus retracting into the openings 130, but the end portions of the leaf springs 132 are also stopped at the baffle 1301 disposed on the inner edge of each opening 130 and bending to extend, so as to prevent the leaf springs 132 from deforming overly and failing to restore an initial state. After the user has pressed and moved the storage device 2 into the receiving space 10 of the body 1 until it is positioned, the bottom of the storage device 2 abuts against the substrate 11 so that the storage device 2 lies transversely, and a limit hole 22 at the bottom of the storage device 2 is engaged with engaging bumps 1111 of the at least one third positioning portion 111 of the substrate 11 to effectuate a positioning. After the storage device 2 has been released, the leaf springs 132 restore an initial state and push the storage device 2 laterally so that the fixing holes 21 of the storage device 2 are engaged with the limit bumps 1311 of the second positioning portions 131, respectively, to effectuate a positioning. The aforesaid design prevents the storage device 2 from being disconnected from the body 1 inappropriately or from getting damaged under an external force. Since the limit holes 22 at the bottom of the storage device 2 are engaged with the engaging bumps 1111 of the at least one third positioning portion 111 to allow them to be positioned, and the storage device 2 resists the pull exerted by a connector (not shown) when the body 1 is withdrawn from the case, the storage device 2 is capable of blocking, positioning, stopping and retracting in a stable manner. Furthermore, the storage device 2 allows an assembly process to be performed quickly and without any tool so as to attain structural stability and ease of operation.

To take out the storage device 2, the user inserts his or her finger into a notch 114 disposed on the rear edge of the substrate 11 and lifts the storage device 2 from below, and in consequence the limit bumps 1311 of the second positioning portions 131 are pushed laterally by the storage device 2 so that the prepressing creases 1322 of the leaf springs 132 are each used as a fulcrum for undergoing an outward swing displacement and thereby retracting into the openings 130. When the fixing holes 21 and the limit holes 22 of the storage device 2 become free from the restraint of the limit bumps 1311 of the second positioning portions 131, the abutting bumps 1211 of the first positioning portions 121, and the engaging bumps 1111 of the at least one third positioning portion 111, the storage device 2 is lifted so that the user can take out the storage device 2 easily. The aforesaid assembly and disassembly processes do not require any screwing operation and thus can be performed without any tool, conveniently, easily, time-efficiently and cost-efficiently, so as to enhance production efficiency as well as ease of maintenance and replacement.

Referring FIG. 6, 7, 8, 9, 10, there are shown a perspective view, an exploded view, another exploded view from another angle of view, a perspective view taken before an storage device is pressed into, and a rear view taken after the storage device is pressed into, of an storage carrier according to another preferred embodiment of the present invention. As shown in the diagrams, a plurality of elevation portions 115, protruding and flat, is disposed on the substrate 11 of the body 1 and positioned proximate to the first frame board 12 and the second frame board 13, whereas the at least one third positioning portion 111 is disposed on the surfaces of the elevation portions 115 and behind the substrate 11 and positioned proximate to the leaf springs 132. The leaf springs 132 and the second frame board 13 are integrally formed. The inner edges of the openings 130 of the second frame board 13 extend downward to form the cantilever-shaped leaf springs 132. The limit bumps 1311 of the second positioning portions 131 are disposed on the inner surfaces of the leaf springs 132 to not only dispense with the coupling portion 133 and the leaf springs 132 of the second frame board 13 but also facilitate modularized mass production.

Figure 9:
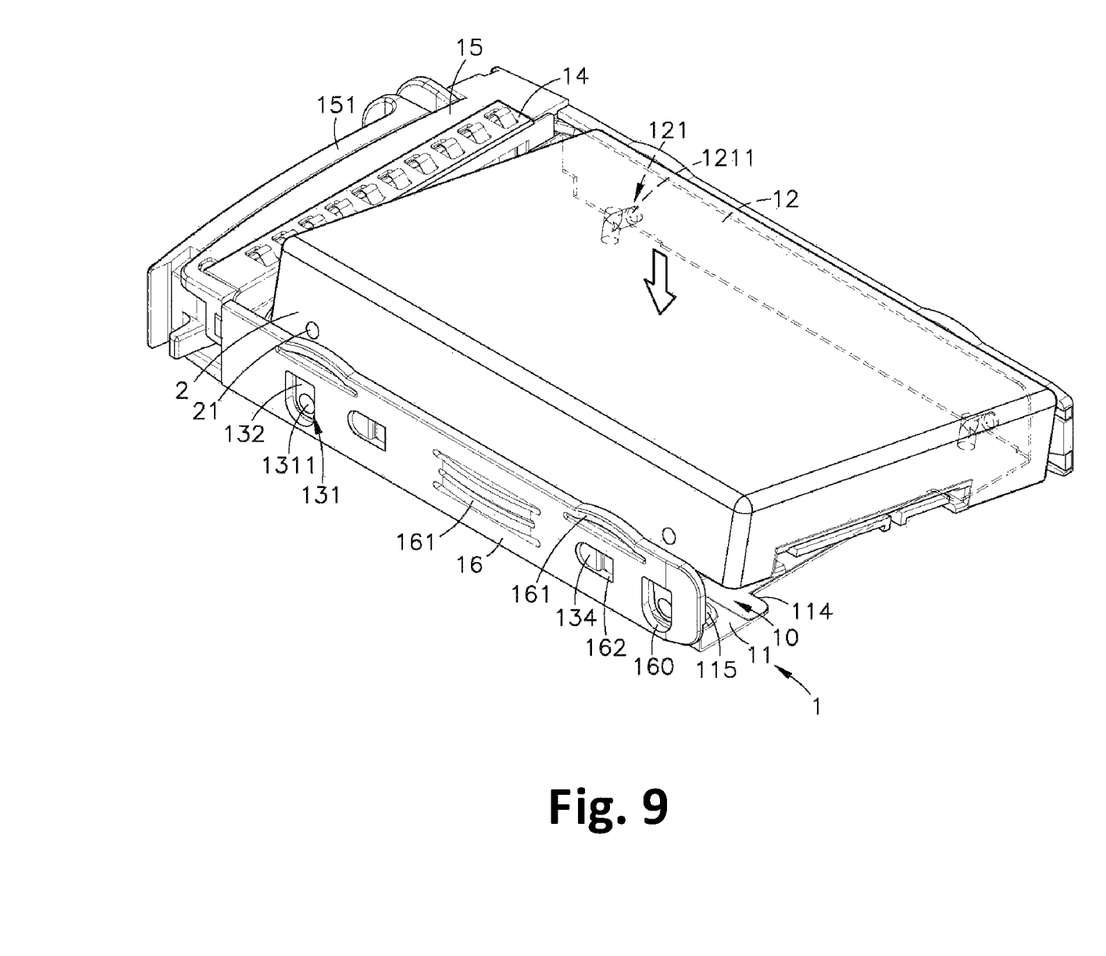
FIG. 9 corresponds to FIG. 6 is another perspective view of the storage carrier according to another preferred embodiment of the present invention.
Figure 10:
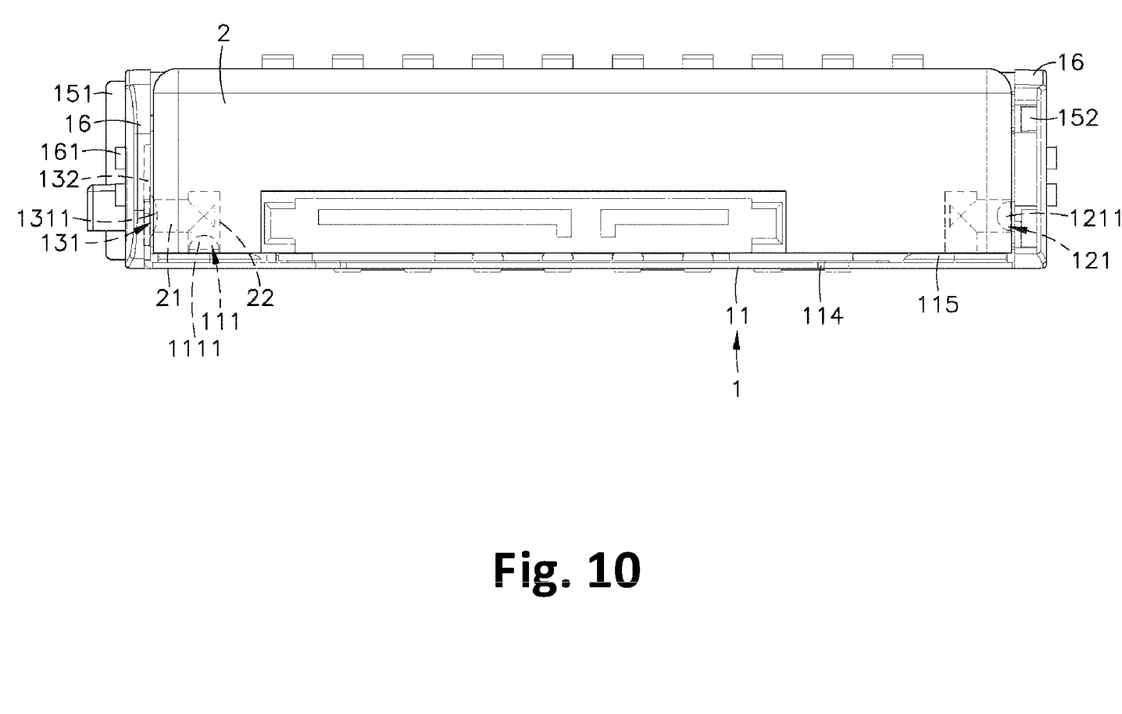
FIG. 10 corresponds to FIG. 6 is a rear view of the storage carrier according to another preferred embodiment of the present invention.

The assembly process of the present invention is described below. One end of the storage device 2 (such as a 2.5-inch hard disk drive) is obliquely inserted into the receiving space 10 of the body 1 to abut against the inner surface of the first frame board 12 so that the fixing holes 21 disposed laterally on the storage device 2 are engaged with the abutting bumps 1211 of the first positioning portions 121, respectively, to effectuate a positioning. Then, the storage device 2 is pressed downward and moved into the receiving space 10 of the body 1, and the bottom of the other end of the storage device 2 is pushed against the second positioning portions 131 of the second frame board 13. As a result, the second positioning portions 131 are pushed to cause the leaf springs 132 to undergo an outward swing displacement. After the storage device 2 has been pressed and moved into the receiving space 10 of the body 1 until it is positioned, the bottom of the storage device 2 abuts against elevation portions 115 of the substrate 11 so that the storage device 2 lies transversely, and the at least one third positioning portion 111 of the substrate 11 is engaged with the limit hole 22 at the bottom of the storage device 2 to effectuate a positioning. After the storage device 2 has been released, the leaf springs 132 restore an initial state and push the storage device 2 laterally so that the fixing holes 21 are engaged with the limit bumps 1311 of the second positioning portions 131, respectively, to effectuate a positioning.

What is claimed is:

1. A storage carrier, comprising a body, the body having a substrate, a first frame board and a second frame board, with the first and second frame boards disposed at two opposite ends of the substrate, respectively, allowing a receiving space to be formed between the first frame board and the second frame board and adapted to receive and position an storage device, wherein first positioning portions and second positioning portions are disposed on opposing inner sides of the first frame board and the second frame board and engaged with fixing holes of the storage device, respectively, with the first positioning portions being of higher structural rigidity than the second positioning portions, wherein a panel is coupled to another end of the substrate and positioned proximate to the first frame board and the second frame board, with a lid movably pivotally connected to the panel, wherein a plurality of leaf springs is disposed on the second frame board of the body and corresponds in position to the first positioning portions, and the second positioning portions are disposed on inner surfaces of the leaf springs to allow the storage device to push and cause the leaf springs to undergo an outward swing displacement and restore an initial state, thereby allowing the fixing holes to engage with the first positioning portions and the second positioning portions.

2. The storage carrier of claim 1, wherein at least one hollowed-out penetrating hole is disposed on the substrate of the body, and a plurality of blocking plates is disposed in front of the at least one penetrating hole and each bend upward to abut against a front of the storage device.

3. The storage carrier of claim 1, wherein at least one third positioning portion is disposed on the substrate of the body and positioned proximate to the second frame board, and the at least one third positioning portion has engaging bumps for engaging with a limit hole disposed at a bottom of the storage device.

4. The storage carrier of claim 1, wherein the first positioning portions of the first frame board of the body are abutting bumps which are cylindrical and extend transversely.

5. The storage carrier of claim 1, wherein a plurality of openings is disposed on the second frame board, corresponds in position to the first positioning portions, and has the leaf springs, and limit bumps, each of which is arcuate and round and rises toward the receiving space, are disposed on the second positioning portion of the leaf springs, respectively.

6. The storage carrier of claim 5, wherein a coupling portion with a plurality of riveting posts is disposed on outer rims of the openings of the second frame board, wherein a plurality of cantilever-shaped fixing holes, which the riveting posts are riveted to and thus fixed in place so that other ends of the leaf springs are transversely inserted into the openings, is disposed laterally on the leaf springs each, wherein longitudinal prepressing creases are formed on the leaf springs and between the second positioning portions and the fixing holes.

7. The storage carrier of claim 5, wherein inner edges of the openings of the second frame board extend downward to form the leaf springs, respectively.

8. The storage carrier of claim 1, wherein the leaf springs are made of one of stainless steel and manganese steel, whereas the substrate, the first frame board and the second frame board of the body are made of a material of a lower coefficient of resilience than the leaf springs, including hot-dip galvanized steel in coils (SGCC) and plastics.

9. A storage carrier, comprising a body, the body having a substrate, a first frame board and a second frame board, with the first and second frame boards disposed at two opposite ends of the substrate, respectively, allowing a receiving space to be formed between the first frame board and the second frame board and adapted to receive and position an storage device, wherein first positioning portions and second positioning portions are disposed on opposing inner sides of the first frame board and the second frame board and engaged with fixing holes of the storage device, respectively, with the first positioning portions being of higher structural rigidity than the second positioning portions, wherein a panel is coupled to another end of the substrate and positioned proximate to the first frame board and the second frame board, with a lid movably pivotally connected to the panel, wherein a front side board is disposed at another end of the substrate of the body and positioned proximate to the first frame board and the second frame board, wherein a light-guiding plate is penetratingly disposed on the panel coupled to the front side board and extends backward to the first frame board, wherein a positioning-engaging plate is coupled to outer surfaces of the first frame board and the second frame board and positioned on an outer side of the light-guiding plate, wherein a plurality of resilient elevated portions is disposed on the positioning-engaging plate.

10. The storage carrier of claim 9, wherein a plurality of snap-engagement plates is disposed on the outer surfaces of the first frame board and the second frame board, wherein a snap-engagement slot is disposed at each of two ends of the panel and posterior to the panel, with a plurality of fastening holes disposed on the positioning-engaging plates such that the snap-engagement plates are engaged with the fastening holes and fitted therein integrally, wherein engaging blocks are disposed in front of the positioning-engaging plates, engaged with and disposed in the snap-engagement slots, respectively, to effectuate a positioning.

\* \* \* \* \*